(12) United States Patent
Ingvarsson et al.

(10) Patent No.: US 7,880,208 B2
(45) Date of Patent: Feb. 1, 2011

(54) MAGNETIC MATERIALS HAVING SUPERPARAMAGNETIC PARTICLES

(75) Inventors: Snorri Thorgeir Ingvarsson, White Plains, NY (US); Philip Louis Trouilloud, Norwood, NJ (US); Shouheng Sun, Millwood, NY (US); Roger Hilsen Koch, Amawalk, NY (US); David William Abraham, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 1630 days.

(21) Appl. No.: 10/458,112

(22) Filed: Jun. 10, 2003

(65) Prior Publication Data

US 2004/0253437 A1 Dec. 16, 2004

(51) Int. Cl.
*H01L 29/76* (2006.01)
(52) U.S. Cl. .................. 257/295; 257/421; 365/173
(58) Field of Classification Search .......... 257/295, 257/421, 428, 429; 365/171, 173
See application file for complete search history.

(56) References Cited

U.S. PATENT DOCUMENTS

| | | | | |
|---|---|---|---|---|
| 5,368,933 | A | 11/1994 | Aoki et al. | 428/329 |
| 6,130,814 | A * | 10/2000 | Sun | 361/143 |
| 6,256,223 | B1 * | 7/2001 | Sun | 365/171 |
| 6,262,129 | B1 | 7/2001 | Murray et al. | 516/33 |
| 6,452,240 | B1 | 9/2002 | Ingvarsson et al. | 257/421 |
| 6,495,252 | B1 * | 12/2002 | Richter et al. | 428/336 |
| 7,054,118 | B2 * | 5/2006 | Daughton et al. | 360/324.2 |
| 2004/0000415 | A1 * | 1/2004 | Rizzo et al. | 174/35 R |
| 2004/0023065 | A1 * | 2/2004 | Daughton et al. | 428/693 |

FOREIGN PATENT DOCUMENTS

EP 0977212 A2 * 7/1999

OTHER PUBLICATIONS

Heinrich et al., "Ferromagnetic-Resonance Study of Ultrathin bcc Fe(100) Films Grown Epitaxially on fcc Ag(100) Subtrates," Physical Review Letters, vol. 59, No. 15, pp. 1756-1759 (Oct. 12, 1987).
Patton et al., "Frequency Dependence of the Parellel and Perpendicular Ferromagnetic Resonance Linewidth in Permalloy Films, 2-36 GHz," Journal of Applied Physics, vol. 46, No. 11, pp. 5002-5003 (Nov. 11, 1975).
Rudd et al., "Anisotropic Ferromagnetic Resonance Linewidth in Nickel at Low Temperatures," Journal of Applied Physics, vol. 57, No. 1, pp. 3693-3695 (Apr. 15, 1985).
Schreiber et al., "Gilbert Damping and g-Factor in $fe_x Co_{1-x}$ Alloy Films," Solid State Communications, vol. 93, No. 12, pp. 965-968 (1995).

(Continued)

*Primary Examiner*—Matthew E Warren
(74) *Attorney, Agent, or Firm*—Ryan, Mason & Lewis, LLP (57) ABSTRACT

Magnetic materials and uses thereof are provided. In one aspect, a magnetic film is provided. The magnetic film comprises superparamagnetic particles on at least one surface thereof. The magnetic film may be patterned and may comprise a ferromagnetic material. The superparamagnetic particles may be coated with a non-magnetic polymer and/or embedded in a non-magnetic host material. The magnetic film may have increased damping and/or decreased coercivity.

3 Claims, 5 Drawing Sheets

OTHER PUBLICATIONS

Silva et al.. "Inductive Measurement of Ultrafast Magnetization Dynamics in Thin-Film Permalloy," Journal of Applied Physics, vol. 85, No. 11, pp. 7849-7862 (Jun. 1, 1999).

Murray, et al., "Monodisperse 3d Transition-Metal (Co, Ni, Fe) Nanoparticles and Their Assembly into Nanoparticle Superlattices," MRS Bulletin, pp. 985-991 (2001).

O'Handley, R.C., "Modern Magnetic Materials Principles and Applications," Wiley-Interscience Publication (2000).

Weisstein, E.W., "Magnetic Susceptibility," http://scienceworld.wolfram.com/physics/magneticsusceptibility.html , downloaded on Aug. 24, 2004.

* cited by examiner

MAGNETIC MATERIALS HAVING SUPERPARAMAGNETIC PARTICLES

FIELD OF THE INVENTION

The present invention relates to magnetic materials and, more particularly, to magnetic materials having superparamagnetic particles associated therewith.

BACKGROUND OF THE INVENTION

A general trend in both storage and electronics has been to make devices smaller and faster. The same trend exists with magnetoelectronic "spintronic" devices, wherein the magnetic regions are becoming ever smaller. Such devices rely, in some cases, on the switching of a region of magnetic material between two or more stable configurations of magnetization, and in other cases (e.g., magnetoresistive field sensors), on biasing of the magnetization away from a single equilibrium configuration by, and in some proportion to, the field being sensed. As magnetic devices are made smaller, and designed to switch faster, the challenge of getting the switched region to relax with certainty to a desired magnetization configuration arises. However, the conducting ferromagnetic materials used in these devices, typically transition metal alloys, have very small intrinsic magnetization damping.

While a switching of the magnetization configuration of a device, e.g., by an externally applied magnetic field or by spin injection, ideally changes the magnetic configuration without any unwanted motion of the magnetization, in practice this rarely occurs. The magnetic region of the device typically precesses rapidly with a large but gradually decreasing amplitude following switching. During the precession period, particularly during the initial stages where the amplitude is large, spin-waves, both thermally excited and those excited by the switching process and defects in the material, can interfere constructively to direct the magnetization to an equilibrium configuration other than the one intended. Even a small probability of such a spurious switching event (i.e., less than 1%) is unacceptable for memory applications. In the case of field sensors, it is also desirable to reach equilibrium quickly, i.e., to reduce the oscillatory response caused by precession of the magnetization about the new equilibrium defined by the field being sensed.

A magnetic switching device or magnetoresistive sensor may comprise a magnetic tunnel junction (MTJ) device or a spin valve (SV) device. An MTJ, in a simplest form, may comprise a stack of two ferromagnetic layers separated by a tunnel barrier at a cross-point of two conductors, one of which may be a word line (WL) and the other a bit line (BL). An SV can be made by replacing the tunnel barrier in an MTJ with a conducting layer. In both cases, the resistance of the device depends strongly on the orientation of the magnetization of the two magnetic layers relative to each other. One of the two magnetic layers is often referred to as a "free" magnetic layer or as a "storage layer." The storage layer may comprise a single ferromagnetic or ferrimagnetic layer, or a synthetic antiferromagnetic structure with more than one ferromagnetic layer separated by one or more non-magnetic spacer layers. The magnetic orientation of the storage layer can be changed by the superposition of magnetic fields generated by programming currents $I_{WL}$ and $I_{BL}$ flowing in the conductors WL and BL, respectively. The other of the two magnetic layers is often referred to as a "fixed," "pinned" or "reference" magnetic layer. The magnetization of the fixed layer is invariant, and as such, the programming currents $I_{WL}$ and $I_{BL}$ do not change the magnetic orientation of this fixed layer. The fixed layer can also comprise a single ferromagnetic or ferrimagnetic layer or a synthetic antiferromagnet consisting of more than one ferromagnetic layer separated by one or more non-magnetic spacer layers. The logical state (e.g., a "0" bit or a "1" bit) is generally stored in the MTJ by changing the orientation of the free magnetic layer relative to the fixed magnetic layer. When both magnetic layers have the same orientation, the MTJ typically has a low resistance associated therewith, as measured between conductors WL and BL. Likewise, the resistance of the MTJ is generally high when the magnetic layers are oriented in opposite directions with respect to one another.

Another way of operating an MTJ is by active readout, wherein the MTJ consists of a storage layer and an "interrogation" layer. The storage layer stores the "state" of the memory. The state of the memory may be determined by reading the output of the device as per the two possible orientations of the interrogation layer. Both the storage and the interrogation layer may be single ferromagnetic or ferrimagnetic layers or synthetic antiferromagnetic structures, as described above.

A conventional magnetic random access memory (MRAM) generally includes a plurality of MTJ devices connected in an array configuration. Exemplary MRAM arrays include cross-point arrays, wherein each memory cell comprises a single MTJ device connected at an intersection of a word line and a corresponding bit line, and an architecture employing a plurality of memory cells, each memory cell comprising a selection transistor coupled in series with an MTJ device. The selection transistor is used for accessing the corresponding MTJ device during a read operation. MRAM circuits are discussed in further detail, for example, in W. Reohr et al., "Memories of Tomorrow," *IEEE Circuits and Devices Mag.*, v. 18, no. 5, p. 17-27 (Sept. 2002), the disclosure of which is incorporated by reference herein.

The magnetization dynamics of magnetic materials are affected by the properties of the magnetic materials. Magnetic material properties of particular importance for magnetic switching devices and magnetoresistive sensors include damping and coercivity. Specifically, damping is the action whereby the amplitude of magnetic precession (oscillatory response) is decreased. Coercivity is a property of a magnetic material wherein the magnetic field required to return the magnetization of a magnetic material from saturation back to zero is measured. The coercive field, $H_c$, can be used to approximate the magnetic field needed to switch the magnetization, i.e., the switching field.

One challenge associated with magnetic switching devices, such as those employing small area structures, is that the shape anisotropy contribution to the switching field, assuming that the small magnetic element has an aspect ratio not equal to one in the plane of the device, increases inversely proportional to the thickness of the small magnetic element (perpendicular to the plane). This effect calls for the use of higher currents to generate the switching fields and brings about increased power consumption and increased heating. It is therefore desirable to be able to contain or decrease the coercivity of small magnetic elements.

The materials used in the above devices are typically ferromagnetic transition metal alloys. These materials tend to be severely underdamped, whether in a bulk form, a thin film or a small lithographically defined element. Certain alloys have been shown to have desirable enhanced damping properties in bulk (approximated by thick film) form. For a detailed description of these alloys, see Ingvarsson et al., U.S. Pat. No. 6,452,240 "Increased Damping of Magnetization in Magnetic Materials," (hereinafter "Ingvarsson") the disclosure of which is incorporated by reference herein. Ingvarsson demonstrates that certain material choices provide improved damping properties of magnetoresistive devices. It would be further desirable to benefit the switching characteristics of a magnetic switching device by changing the structure of these devices, without affecting the composition of the magnetic materials.

Examples of underdamped magnetic materials include Permalloym magnetic films, a trademark of B&D Industrial & Mining Services, Inc., having the composition $Ni_{81}Fe_{19}$, which have been shown to exhibit magnetization oscillations after magnetic switching. For a detailed description of the magnetization dynamics of these Permalloy™ magnetic films, see for example, T. J. Silva et al., "Inductive Measurement of Ultrafast Magnetization Dynamics in Thin-Film Permalloy," *J Appl. Phys.*, v. 85, no. 11, p. 7849 (1999), and S. Ingvarsson et al., "Role of electron scattering in the magnetization relaxation of thin $Ni_{81}Fe_{19}$ films," the disclosures of which are incorporated by reference herein.

The damping properties of films comprising pure ferromagnetic transition elements, such as nickel, iron or cobalt are known. The damping properties of these elements are characterized by damping parameters that are too small to achieve optimal switching behavior in devices. For a detailed description of the damping properties in such materials, see J. M. Rudd et al., "Anisotropic Ferromagnetic Resonance Linewidth in Nickel at Low Temperatures," *J Appl. Phys.*, v. 57, no., 1 p. 3693 (1985); B. Heinrich et al., "Ferromagnetic-Resonance Study of Ultrathin bcc Fe(100) Films Grown Epitaxially on fcc Ag(100) Substrates," *Phys. Rev. Lett.*, v. 59, no. 15, p. 1756 (1987); and Schreiber et al., "Gilbert Damping and g-Factor in $Fe_xCo_{1-x}$ Alloy Films," *Sol. St. Comm.* v. 93, no. 12, p. 965 (1995) (hereinafter "Schreiber"), the disclosures of which are incorporated by reference herein. It has also been shown that alloys of these particular metals have damping parameters in the same order of magnitude as the constituent metals, see Schreiber; C. E. Patton et al., "Frequency Dependence of the Parallel and Perpendicular Ferromagnetic Resonance Linewidth in Permalloy Films, 2-36 GHz," *J Appl. Phys.* v. 46, no. 11, p. 5002 (1975), the disclosures of which are incorporated by reference herein.

A magnetic switching device has been created with a switching threshold that is more stable than conventional switching devices. See Sun, U.S. Pat. No. 6,256,223, "Current-Induced Magnetic Switching Device and Memory Including the Same." The magnetic switching device comprises two electrodes, at least one of which is ferromagnetic, and a single nanoparticle in between the two electrodes. The electrodes with the nanoparticle therebetween form an electrical switch. Switching of the device centers on the magnetic moment of the particle. Namely, a current is injected through the electrodes, and the nanoparticle therebetween, to overcome the magnetic moment of the particle and switch the device. Further, the magnetic switching device requires that a large diameter nanoparticle, on the order of several hundred angstroms, be employed.

Accordingly, it would be desirable to provide a magnetic material with beneficial properties for use in applications, such as magnetoelectronic devices, including but not limited to magnetic switching devices and magnetoresistive sensors. Beneficial properties include favorable magnetization properties, namely, increased damping and decreased coercivity. Favorable magnetization dynamics (i.e., increased damping) help the devices reach an equilibrium magnetic state, following a perturbation, in a more predictable and accurate manner. Lowering of coercivity allows for a more energy efficient switching and reduces unwanted heating. By being able to employ a magnetic material with these beneficial properties, more accurate and consistent devices may be produced.

SUMMARY OF THE INVENTION

The present invention provides magnetic materials and uses thereof. In one aspect of the invention, a magnetic film is provided. The magnetic film comprises superparamagnetic particles on at least one surface thereof. The magnetic film may be patterned and may comprise a ferromagnetic material. The superparamagnetic particles may be coated with a non-magnetic polymer and/or embedded in a non-magnetic host material. The magnetic film may have increased damping and/or decreased coercivity.

In another aspect of the invention, a magnetic switching device comprising two magnetic layers with a barrier layer therebetween, wherein at least one of the magnetic layers comprises a magnetic film comprising superparamagnetic particles on at least one surface thereof is provided. The superparamagnetic particles may be spatially separated from the magnetic film.

In yet another aspect of the invention, a magnetic random access memory (MRAM) is provided. The MRAM comprises a plurality of memory cells; and a plurality of word lines and a plurality of bit lines operatively coupled to the memory cells for selectively accessing the memory cells, wherein at least one of the memory cells comprises a magnetic switching device including a magnetic film comprising superparamagnetic particles on at least one surface thereof.

In a further aspect of the invention, a magnetic film comprising at least one superparamagnetic particle on at least one surface thereof is provided. The at least one superparamagnetic particle has a diameter of about three nanometers to about 12 nanometers. In a further aspect of the invention, a magnetic film comprising at least one superparamagnetic particle embedded therein is provided.

In yet a further aspect of the invention, a method for forming a magnetic film comprising superparamagnetic particles is provided. The method comprises the following steps. The magnetic film is formed. The superparamagnetic particles are deposited on at least one surface of the magnetic film. The superparamagnetic particles may be deposited using sputtering, evaporative, laser ablative, and/or self-assembly techniques. The method may further comprise the following steps. At least one non-magnetic layer is deposited. The superparamagnetic particles embedded in the at least one non-magnetic layer are formed by thermal treatment.

A more complete understanding of the present invention, as well as further features and advantages of the present invention, will be obtained by reference to the following detailed description and drawings.

DETAILED DESCRIPTION OF PREFERRED EMBODIMENTS

The present invention will be described below in the context of illustrative magnetic materials and uses thereof. However, it is to be understood that the teachings of the present invention are not to be limited to any particular conformation or implementation thereof.

Figure 1:
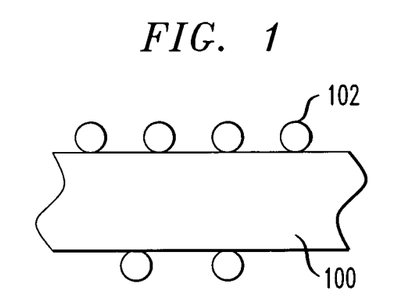
FIG. 1 is a diagram illustrating an exemplary configuration of a magnetic film according to an embodiment of the present invention.
Figure 2:
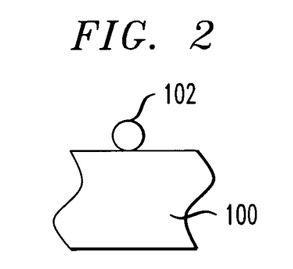
FIG. 2 is a diagram illustrating an exemplary configuration of a magnetic film according to another embodiment of the present invention.

FIG. 1 and FIG. 2 are diagrams illustrating exemplary configurations of a magnetic film. Specifically, FIG. 1 is a diagram illustrating an exemplary configuration of at least a portion of a magnetic film comprising superparamagnetic particles on at least one surface thereof. In the exemplary embodiment shown in FIG. 1, magnetic film 100 comprises superparamagnetic particles 102 on multiple surfaces thereof.

According to the teachings of the present invention, magnetic film 100 may comprise a ferromagnetic material. Magnetic film 100 may be formed having a homogeneous or heterogeneous composition comprising any suitable ferromagnetic materials including ferromagnetic metals, such as, nickel, iron, cobalt and alloys thereof that may also include chromium, molybdenum, copper, boron or carbon. In an exemplary embodiment of the present invention, magnetic film 100 is formed comprising a nickel-iron alloy of the formula $Ni_{80}Fe_{20}$, for example, Permalloy™. Further, any of the above metals may be present, either independently or in combination, in distinct layers or regions within magnetic film 100.

Depending on the particular application, the thickness of magnetic film 100 may vary. According to one exemplary embodiment, magnetic film 100 has a thickness of greater than or equal to about five nanometers, such as in the range of between about five nanometers to about 200 nanometers. According to another exemplary embodiment, magnetic film 100 has a thickness of less than or equal to about five nanometers, such as in the range of between about 0.5 nanometers to about five nanometers. The film thicknesses provided herein are merely exemplary, and it is to be understood that magnetic film 100 may be of any thickness, as long as that thickness is sufficient to form a continuous film.

Magnetic film 100 further comprises superparamagnetic particle 102. A superparamagnetic particle is a particle that has long range ferromagnetic order, but a volume that is small enough to have a thermal energy comparable with its anisotropy energy, therefore making the equilibrium magnetization unstable. Superparamagnetic particle 102 may comprise a nanoparticle. The classification of a particle as a nanoparticle depends on size, measured as the diameter of the particle. The parameters for the nanoparticle of the present invention are described below. As is also described below, the nanoparticle may comprise a metal, i.e., a transition metal.

According to the teachings of the present invention, any suitable technique for forming nanoparticles may be employed. For example, a method for nanoparticle formation is provided in Murray, et al., U.S. Pat. No. 6,262,129, "Method For Producing Nanoparticles of Transition Metals," the disclosure of which is incorporated by reference herein. The teachings of the present invention should, however, not be limited to any of the particular teachings provided therein.

As highlighted above, the nanoparticle may comprise a metal, i.e., a transition metal. Suitable transition metals include, but are not limited to, cobalt, nickel, iron, platinum, and alloys and intermetallics of at least one of the foregoing transition metals. Further, the procedures used to form nanoparticles may result in the nanoparticles having a polymer coating. The polymer coating may be non-magnetic, and as such, may act as a magnetic exchange decoupling barrier around the nanoparticle.

The dimensions of the nanoparticle impact the particle characteristics. Particularly, the dimensions of the nanoparticle impact the magnetic properties of the nanoparticle. In accordance with the teachings of the present invention, the nanoparticle has a diameter in the range of between about three nanometers to about 12 nanometers.

Superparamagnetic particle 102 may be in direct contact with magnetic film 100 (FIG. 1), embedded in a non-magnetic host material and/or spatially separated from magnetic film 100, as will be described in conjunction with the description of FIG. 3. To be in direct contact with magnetic film 100, superparamagnetic particle 102 may be on at least one of the surfaces of magnetic film 100 (FIG. 1 and FIG. 2), within magnetic film 100 (FIG. 5), or both (not shown). As is shown in FIG. 1, superparamagnetic particles 102 are present on the surfaces of magnetic film 100. Magnetic film 100 may comprise at least one superparamagnetic particle 102 on at least one surface thereof. Thus, magnetic film 100 may comprise a plurality of superparamagnetic particles 102, or alternatively, a single superparamagnetic particle 102. FIG. 2 is a diagram illustrating an exemplary configuration of a magnetic film. Specifically, FIG. 2 is a diagram illustrating at least a portion of magnetic film 100 comprising a single superparamagnetic particle 102 on a surface thereof.

Superparamagnetic particle 102 may be attached to the surfaces of magnetic film 100 using any suitable adhesive techniques. In addition, cohesive forces, i.e., molecular attraction forces, are sufficient to cohere and retain superparamagnetic particle 102 on the surface of magnetic film 100. Thus, in an exemplary embodiment, superparamagnetic particle 102 is cohered to magnetic film 100 using cohesive forces.

Superparamagnetic particles 102 on the surfaces of magnetic film 100 may be embedded in a non-magnetic host material. FIG. 3 is a diagram illustrating an exemplary configuration of at least a portion of a magnetic film having superparamagnetic particles embedded in a non-magnetic host material. Specifically, FIG. 3 is a diagram illustrating superparamagnetic particles 102 embedded in non-magnetic host material 302, forming a monolayer on magnetic film 100, i.e., superparamagnetic layer 306. As shown in FIG. 3, and as may be applicable to other embodiments herein, for example those illustrated in FIGS. 1-2, 4 and 6-8, superparamagnetic particles 102 embedded in non-magnetic host material 302 may be spatially separated from magnetic film 100 by spacer layer 304. Spacer layer 304 prevents short range magnetic exchange interactions, while optionally permitting long range, weak interactions. Spacer layer 304 may comprise any material suitable for spatially separating superparamagnetic particles 102 embedded in non-magnetic host material 302 and preventing short range magnetic exchange interactions. Suitable materials for use in spacer layer 304 include, but are not limited to, metals, insulator materials, semiconductor materials, and combinations comprising at least one of the foregoing materials.

Spacer layer 304 should have a thickness sufficient to prevent short range magnetic interactions. In an exemplary embodiment, spacer layer 304 has a thickness of about ten angstroms to about 100 angstroms. While FIG. 3 includes spacer layer 304, this particular configuration is merely exemplary and it is to be understood that superparamagnetic particles 102 embedded in non-magnetic host material 302 may be in contact with at least one of the surfaces of magnetic film 100.

Figure 3:
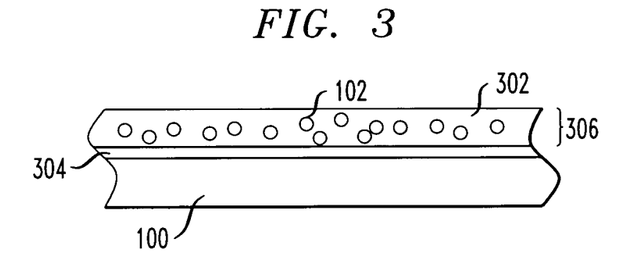
FIG. 3 is a diagram illustrating an exemplary configuration of a magnetic film having superparamagnetic particles embedded in a non-magnetic host material according to an embodiment of the present invention.

As shown in FIG. 3, non-magnetic host material 302 may have a plurality of superparamagnetic particles 102 embedded therein. However, non-magnetic host material 302 might have a single superparamagnetic particle 102 embedded therein (not shown). Suitable non-magnetic host materials include, but are not limited to, non-magnetic metals, insulator materials, semiconductor materials, and combinations comprising at least one of the foregoing non-magnetic host materials.

Figure 4:
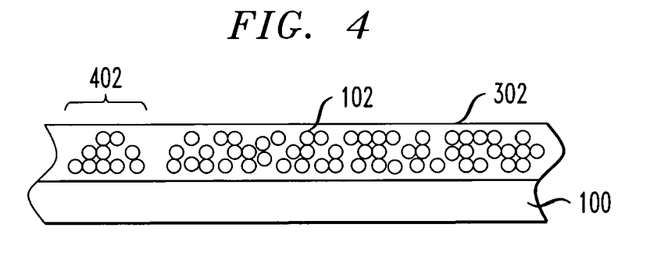
FIG. 4 is a diagram illustrating an exemplary configuration of a magnetic film having multiple superparamagnetic layers according to an embodiment of the present invention.

A plurality of superparamagnetic particles 102 may form multiple layers on at least one of the surfaces of magnetic film 100, as is shown in FIG. 4. FIG. 4 is a diagram illustrating an exemplary configuration of at least a portion of magnetic film 100 having multiple superparamagnetic layers. As described above, cohesive forces are sufficient to cohere or attach superparamagnetic particles 102 to magnetic film 100. These forces are also sufficient to cohere the multiple superparamagnetic layers to magnetic film 100. Further, as is shown in FIG. 4, the multiple superparamagnetic layers may be embedded in a non-magnetic host material, e.g., non-magnetic host material 302 (FIG. 3).

Further, in accordance with the teachings of the present invention, the multiple superparamagnetic layers may have discontinuities throughout, yet still provide the desired properties in magnetic film 100. For example, the multiple superparamagnetic layers may contain a cluster of superparamagnetic particles forming a superparamagnetic island, i.e., superparamagnetic island 402. Depending on the desired application, a plurality of superparamagnetic islands, such as superparamagnetic island 402, may be distributed over the entirety, or portions, of one or more surfaces of magnetic film 100.

Figure 5:
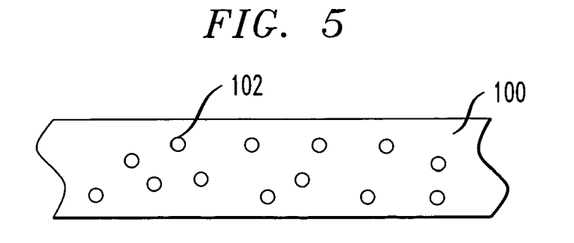
FIG. 5 is a diagram illustrating an exemplary configuration of a magnetic film having superparamagnetic particles embedded therein according to an embodiment of the present invention.

In an alternative embodiment of the present invention, superparamagnetic particles 102 may be embedded within magnetic film 100, as is shown in FIG. 5. FIG. 5 is a diagram illustrating an exemplary configuration of at least a portion of a magnetic film having superparamagnetic particles embedded therein. While FIG. 5 shows a plurality of superparamagnetic particles 102 embedded in magnetic film 100, this configuration is merely exemplary and the teachings herein further encompass embodiments wherein a single superparamagnetic particle 102 is embedded in magnetic film 100. Superparamagnetic particle 102 may be embedded in magnetic film 100, for example, during deposition of magnetic film 100 by conventional electrochemistry techniques.

Figure 6:
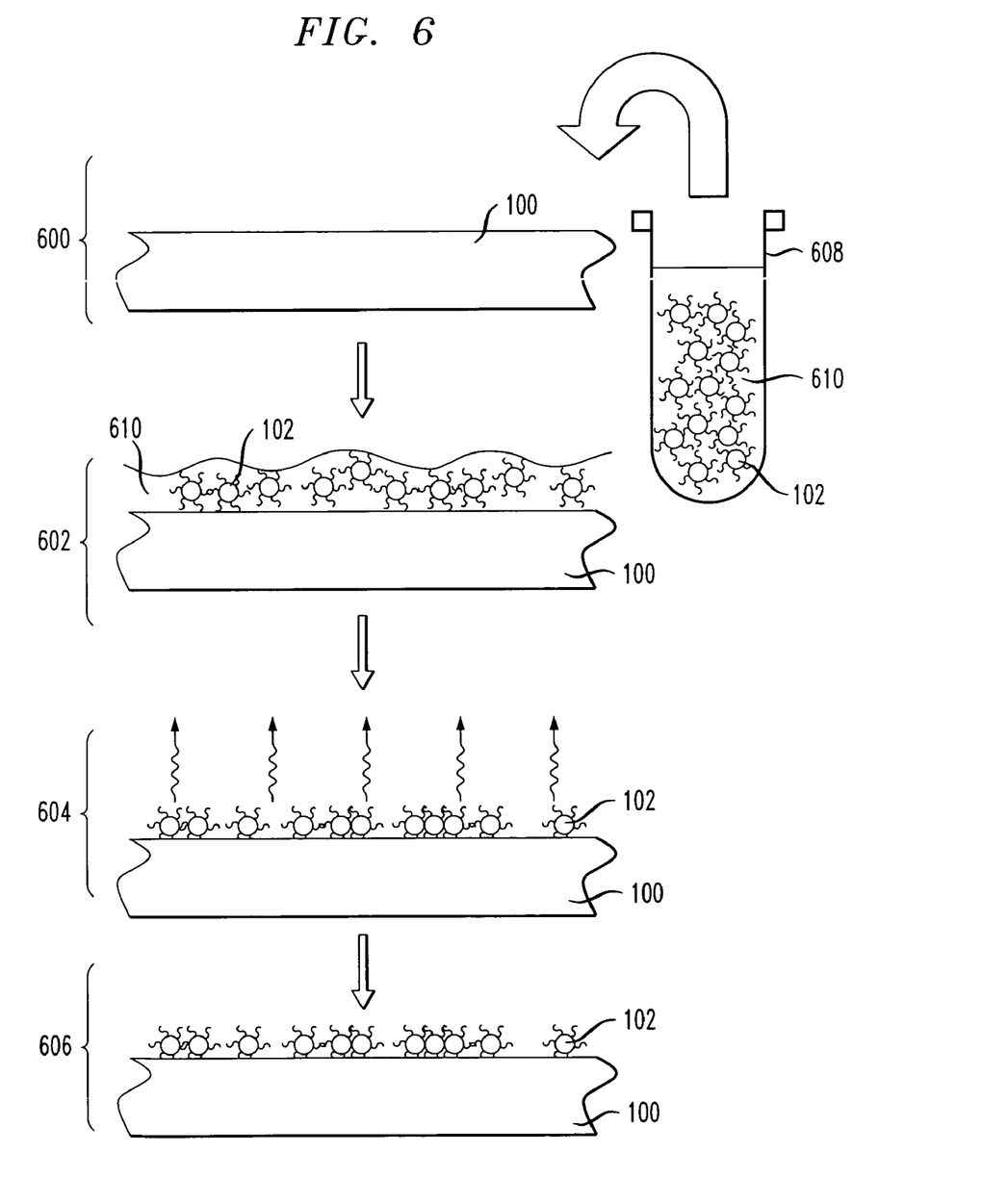
FIG. 6 is a diagram illustrating an exemplary self-assembly deposition technique according to an embodiment of the present invention.

FIG. 6 is a diagram illustrating an exemplary self-assembly deposition technique that may be employed to deposit superparamagnetic particles 102 on the surface of magnetic film 100. As is shown in FIG. 6, simple evaporative deposition techniques may be employed. In step 600 of FIG. 6, a plurality of superparamagnetic particles 102 are dispersed within a solvent 610, in vessel 608. Solvent 610 may comprise any solvent, or combination of solvents, useful for evaporative deposition. Suitable solvents include, but are not limited to, octane, hexane or methane. As is further shown in step 600 of FIG. 6, and in subsequent steps thereafter, superparamagnetic particles 102 may be coated with a polymer. The polymer may be non-magnetic. As was described above, the non-magnetic polymer coating may act as a magnetic exchange decoupling barrier around the superparamagnetic particle.

The plurality of superparamagnetic particles 102 dispersed within solvent 610 may then be deposited on magnetic film 100. As is shown in step 602, a plurality of superparamagnetic particles 102 dispersed within solvent 610 are spread over a surface of magnetic film 100. For simplicity, the depiction in FIG. 6 shows a plurality of superparamagnetic particles 102 dispersed within solvent 610 being spread as a single layer over only a single surface of magnetic film 100. However, it is to be understood that according to the techniques described herein, the plurality of superparamagnetic particles 102 may be deposited in multiple layers and on more than one surface of magnetic film 100.

As is shown in step 604, solvent 610 is evaporated leaving a plurality of self-assembled superparamagnetic particles 102 on the surface of magnetic film 100. Typically, a solvent may be evaporated by applying heat to the solution, causing the solvent to dissipate as a vapor. However, a solvent may be evaporated at ambient temperatures, and thus the application of heat is not required for evaporation to occur. According to an embodiment of the invention, the plurality of superparamagnetic particles 102 dispersed within solvent 610 are poured over magnetic film 100 and magnetic film 100 is heated until all of solvent 610 is evaporated. As is shown in step 606, a single layer, i.e., monolayer, of superparamagnetic particles 102 is formed.

Each of the steps of the above deposition technique may be performed multiple times, together or independently, and in any order, to increase the number of superparamagnetic particles 102 dispersed on the surfaces of magnetic film 100. Likewise, as was described above in connection with the description of FIG. 3, the present deposition techniques may be used to form superparamagnetic layer 306. Similarly, the deposition techniques may be performed multiple times to form multiple superparamagnetic layers, as was shown in FIG. 4.

In an exemplary embodiment, each of a plurality of superparamagnetic layers are deposited independently, with each additional layer being deposited on the previously deposited layer. In this exemplary conformation, the composition of each superparamagnetic layer may vary, e.g., the composition of the superparamagnetic particles within each superparamagnetic layer may vary.

In addition to the self-assembly technique described above, the plurality of superparamagnetic particles 102 may also be deposited on the surfaces of magnetic film 100 using conventional sputtering, evaporation, or laser ablation techniques. Conventional sputtering techniques, as well as co-deposition techniques, may be used to embed superparamagnetic particles 102 in non-magnetic host material 302 (FIG. 3). Co-deposition techniques, i.e., co-sputtering typically involves sputtering material simultaneously from two or more sputter targets. Thus, according to the teachings herein, superparamagnetic particles 102 may be co-sputtered along with the non-magnetic host material comprising non-magnetic host material 302, onto magnetic film 100.

In an exemplary embodiment, superparamagnetic particles 102 may be embedded in non-magnetic host material 302 (FIG. 3) by depositing uniform layers, thermally treating the layers to promote interdiffusion of material, and the formation of superparamagnetic particles embedded in the non-magnetic host material. Superparamagnetic particles 102 will then be present in non-magnetic surroundings.

When superparamagnetic particles 102 are deposited on the surfaces of magnetic film 100, the particles are allowed to self-assemble. Self-assembly of superparamagnetic particles 102 ensures an even distribution of the particles about the surfaces of magnetic film 100.

As will be described in detail below, the magnetic film of the present invention may be employed as at least one, or portions of at least one, of the magnetic layers of a magnetic switching device. By introducing superparamagnetic particle 102 to magnetic film 100, an increased damping of magnetic film 100, and consequently the magnetic switching device, is realized. The energy from the magnetization precession in magnetic film 100 is transferred to superparamagnetic particle 102 by excitation of the magnetization of superparamagnetic particle 102.

For example, when magnetic film 100 is used as a component of a magnetic switching device, increased damping results. As the device is switched, switching energy, namely, fast, large angle magnetization rotations are produced. Without damping, the magnitude of the switching energy may result in the unpredictable, uncontrollable and undesirable switching of the element. The superparamagnetic nanoparticles are useful in increasing the magnetization damping by dissipating the switching energy, thus, improving the switching characteristics of the magnetic switching device.

Figure 7:
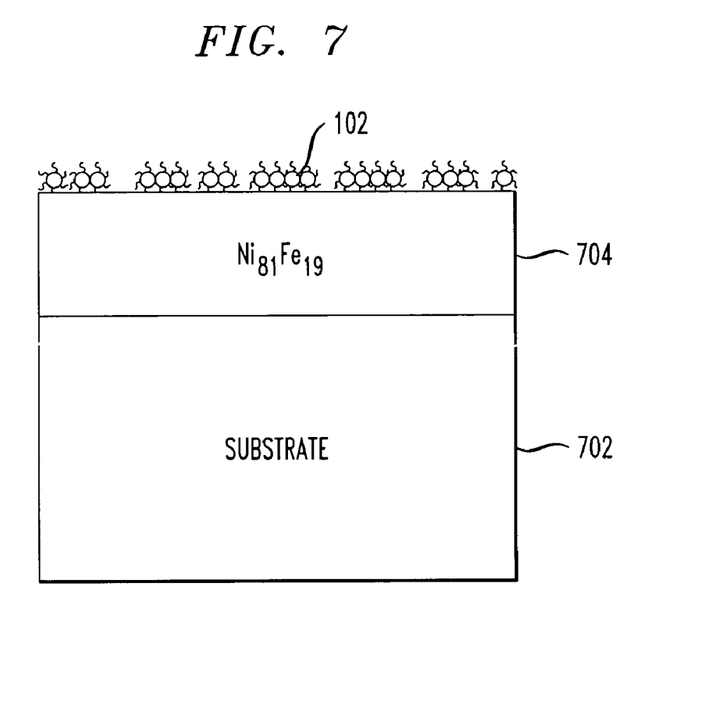
FIG. 7 is a diagram illustrating a cross-section of an exemplary magnetic element test structure suitable for ferromagnetic resonance measurements (FMR) according to an embodiment of the present invention.

One way of testing the damping properties of magnetic film 100 is to make a magnetic element test structure suitable for ferromagnetic resonance measurements (FMR). FIG. 7 is a diagram illustrating a cross-section of an exemplary magnetic element test structure suitable for FMR. For example, the magnetic element test structure may be a thin circular disk. The magnetic element test structure may comprise an oxidized silicon substrate 702, a magnetic film 704 and self-assembled superparamagnetic particles 102. The magnetic element test structure may use a commercially available oxidized silicon substrate 702 as a base. Magnetic film 704 may be deposited by direct current (DC)-magnetron sputtering in a high vacuum chamber. Magnetic film 704 may have a thickness in the range of about four nanometers to about 60 nanometers. Magnetic film 704 may comprise any suitable magnetic material, including but not limited to, $Ni_{81}Fe_{19}$. Superparamagnetic particles 102 are deposited on top of the magnetic film 704. As is shown in FIG. 7, superparamagnetic particles 102 are coated with a non-magnetic polymer.

The magnetic damping properties of the magnetic element test structure may be determined. For a detailed description of the determination of magnetic damping properties of a magnetic test structure, see Ingvarsson.

The damping may be expressed in terms of the Gilbert damping parameter, α, that enters the Landau-Lifshitz-Gilbert equation of motion for magnetization:

$$\frac{dM}{dt} = -\gamma M \times H + \frac{a}{M} M \times \frac{dM}{dt} \qquad (1)$$

wherein γ is the gyromagnetic ratio, M is magnetization, H is effective magnetic field and t is time. A linearization of equation 1 gives the following form for the susceptibility when the applied DC field is perpendicular to the direction of the alternating current (AC) field generated by the current loop:

$$\chi = \frac{\gamma^2 M \left(H + \left(4\pi + \frac{H_k}{M}\right)M\right) + i\frac{\omega}{\gamma}a}{\omega_{r,a=0}^2 - \omega^2(1+a^2) + i\omega a\gamma\left(2H + \left(4\pi + \frac{2H_k}{M}\right)M\right)} \qquad (2)$$

wherein $H_k$ is an in-plane uniaxial anisotropy field, and surface effects are neglected. The undamped resonance frequency may be defined as:

$$\omega_{r,a=0}^2 = \gamma^2 \left(H + \left(4\pi + \frac{H_k}{M}\right)M\right)(H + H_k) \qquad (3)$$

Exchange effects and radio frequency skin depth effects are negligible at the relatively low frequency, i.e., less than or equal to three gigahertz (GHz), at which Permalloy™ films resonate and at the geometric dimensions of the test structure of the present invention. The saturation magnetization may be obtained using any suitable magnetometry technique, such as vibrating sample magnetometry (VSM), alternating gradient magnetometry (AGM) or super conducting quantum interference device (SQUID)-magnetometry. The anisotropy field can also be determined by the techniques described above. However, at high frequencies, results for anisotropy can differ substantially from the DC-results. Therefore, the anisotropy field may be obtained from the angular dependence of the resonance frequency. With the parameters defined, equation 2 may be fit to experimental results regarding susceptibility to determine the Gilbert damping parameter, α.

In accordance with the teachings of the present invention, magnetic film 100 may be patterned and may be employed in a small area structure, and as such, may also exhibit increased coercivity. The coercivity increases may be contained by the introduction of superparamagnetic particles 102, as described above. Containing or decreasing the coercivity by deposition of nanoparticles over such small area structures can therefore help decrease the switching field and unwanted heating.

The magnetic film of the present invention may be used in a variety of applications. For example, the magnetic film may be used in a spin valve or in a magnetic tunnel junction, as well as in magnetic switching devices employed in high frequency switching applications. The magnetic film may be employed, for example, in a magnetic random access memory (MRAM) device, as is described in detail below.

Figure 8:
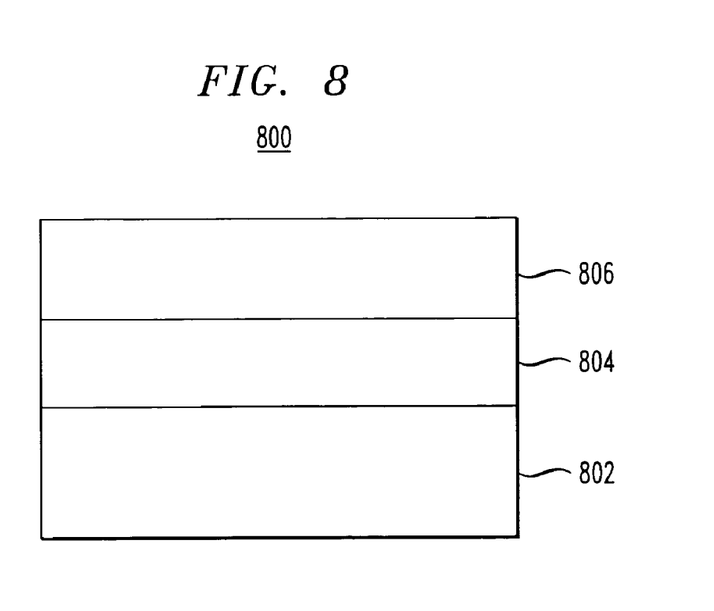
FIG. 8 is a diagram illustrating a cross-section of an exemplary magnetic switching device according to an embodiment of the present invention.

FIG. 8 is a diagram illustrating a simplified cross-section of an exemplary magnetic switching device, magnetic tunnel junction 800. In this application, the magnetic switching device comprises magnetic layer 802, barrier layer 804 and magnetic layer 806. Magnetic layers 802 and 806 are separated by barrier layer 804. Suitable barrier layers comprise non-magnetic materials, including, but not limited to, oxidized aluminum. Any suitable technique may be employed to form barrier layer 804. In an exemplary embodiment wherein barrier layer 804 comprises oxidized aluminum, aluminum may first be deposited and subsequently oxidized throughout. The resistance of magnetic tunnel junction 800, as measured between magnetic layers 802 and 806, is strongly dependent on the relative magnetization orientation of magnetic layers 802 and 806. In an exemplary embodiment, one of magnetic layers 802 or 806 serves as the fixed magnetic layer, while the other of magnetic layers 802 or 806 serves as the free magnetic layer. The free magnetic layer may be "switched" by reversing the magnetic direction thereof (i.e., a rotation of 180 degrees) by application of magnetic fields or by spin injection.

The magnetic materials of the present invention may be employed as either, or both of, the fixed magnetic layer or the free magnetic layer. In an exemplary embodiment, a magnetic film comprising superparamagnetic particles on at least one surface thereof is employed as the free magnetic layer. Further, as was described in conjunction with the description of FIG. 3, a spacer layer, i.e., spacer layer 304, may be present to spatially separate the superparamagnetic particles from the magnetic film.

The magnetic switching device, as highlighted above in conjunction with the description of FIG. 8, may be employed in an MRAM device. An MRAM device typically comprises a plurality of memory cells and a plurality of word lines and a plurality of bit lines operatively coupled to the memory cells for selectively accessing the memory cells. At least one of the memory cells may comprise the magnetic switching device, as in FIG. 8. The magnetic switching device may comprise one or more of the magnetic materials disclosed herein. In an exemplary embodiment, the magnetic switching device includes a magnetic film comprising superparamagnetic particles on at least one surface thereof.

As highlighted above in reference to the description of FIG. 8, one or more of the magnetic films disclosed herein may be employed as one, or both, of magnetic layers 802 or 806. The same configurations apply when the magnetic switching device is employed in an MRAM device. In an exemplary embodiment, magnetic film 100 with superparamagnetic particles 102 on at least one surface thereof is used as the free layer in the MRAM system to achieve favorable switching characteristics, namely, increased damping and decreased coercivity. Each of the magnetic layers of the magnetic switching device employed in the MRAM device have the dimensions of about 100 square nanometers. In an exemplary embodiment, superparamagnetic particles 102 form superparamagnetic layer 306 (FIG. 3) on the surface of magnetic film 100 of each magnetic switching device employed in the MRAM device. Thus, in this particular embodiment, given the particle size range of the superparamagnetic particles, about 100 superparamagnetic particles per superparamagnetic layer 306 are distributed onto magnetic film 100 in the MRAM structure. Furthermore, magnetic film 100, used in the MRAM structure, may comprise multiple superparamagnetic layers, as shown in FIG. 4.

Although illustrative embodiments of the present invention have been described herein, it is to be understood that the invention is not limited to those precise embodiments, and that various other changes and modifications may be made by one skilled in the art without departing from the scope or spirit of the invention. The following example is provided to illustrate the scope and spirit of the present invention. Because the example is given for illustrative purposes only, the invention embodied therein should not be limited thereto.

EXAMPLE

Figure 9:
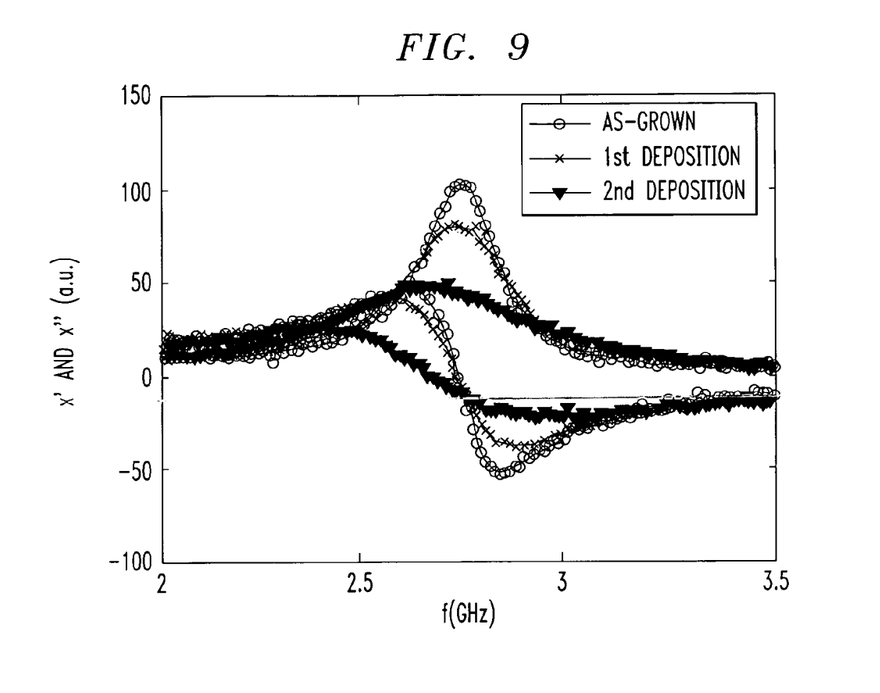
FIG. 9 is a plot illustrating magnetic susceptibility as a function of frequency in samples of magnetic films according to an embodiment of the present invention.

A magnetic film was synthesized with superparamagnetic layers comprising superparamagnetic particles deposited on the surface thereof. The damping properties of the film were tested with FMR, as described above. The superparamagnetic particles used for the test comprised cobalt, and were formed with an average diameter of about nine nanometers. The magnetic film was made comprising Permalloy™, $Ni_{81}Fe_{19}$. The magnetic film was formed in the shape of a disk with a diameter of about 1.8 millimeters and having a thickness of about 30 nanometers. The damping properties of the film were tested at three stages of deposition of the superparamagnetic particles, namely, prior to deposition; after a first deposition and self-assembly of superparamagnetic particles; and after a second deposition and self-assembly of superparamagnetic particles of the second deposition on top of the first. The results are shown plotted in FIG. 9. FIG. 9 is a plot illustrating magnetic susceptibility as a function of frequency in the magnetic film samples. In FIG. 9, "as-grown" indicates the Permalloy™ film without any superparamagnetic particles present, "$1^{st}$ deposition" indicates the first deposition of superparamagnetic particles deposited on the surface of the Permalloy™ film, and "$2^{nd}$ deposition" indicates the second deposition of superparamagnetic particles deposited on top of the first superparamagnetic layer and the Permalloy™ film.

In FIG. 9, increased damping of the magnetic film is indicated by a reduced, broadened curve. Thus, the sample having the least amount of damping is the Permalloy™ film without superparamagnetic particles present. The first superparamagnetic particle deposition on the Permalloy™ film increases the damping of the magnetic film. The second deposition of superparamagnetic particles, on top of the first, further increases the damping of the magnetic film. Thus, increasing the amount of superparamagnetic particles on the surface of the magnetic film is an effective way of increasing the magnetization damping effect on the magnetic film.

Figure 10:
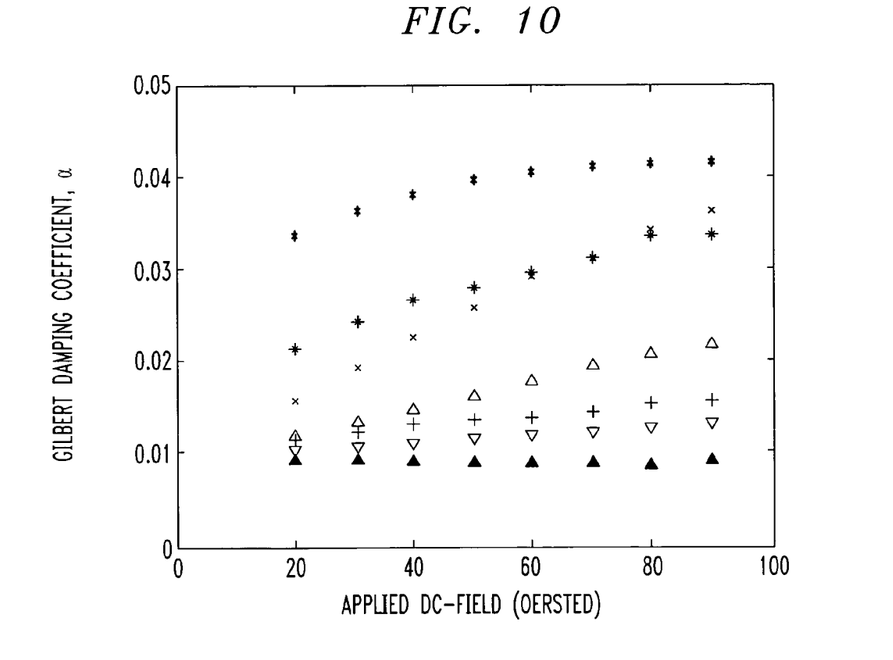
FIG. 10 is a plot illustrating damping coefficients as a function of an applied direct current (static) magnetic field of the magnetic film samples according to an embodiment of the present invention.

FIG. 10 is a plot illustrating the Gilbert damping coefficients as a function of an applied direct current (static) magnetic field of the magnetic film samples. In FIG. 10, several samples of the Permalloy™ film with superparamagnetic particles are shown contrasted with the "as grown" sample of the Permalloy™ film without superparamagnetic particles present. Specifically, the solid triangles (indicated by the symbol "▼") represent data points from the "as grown" sample of the Permalloy™ film without superparamagnetic particles present. The "as grown" sample is included as a reference. The open, inverted triangles (indicated by the symbol "∇") represent data points from the "$1^{st}$ deposition" sample having a first superparamagnetic layer deposited on the surface of the Permalloy™ film. The open triangles (indicated by the symbol "Δ") represent data points from the "$2^{nd}$ deposition" sample having a second superparamagnetic layer deposited on the surface of the first superparamagnetic layer opposite the Permalloy™ film. All other symbols, namely plus symbols (indicated by the symbol "+"), stars (indicated by the symbol "*"), cross marks (indicated by the symbol "x") and dots (indicated by the symbol "•"), represent data points from samples of the Permalloy™ films with superparamagnetic particles deposited with the same technique as described above, but with different particle density and arrangement. In all cases of particles on the surface of the magnetic films, the damping effect increases with increasing magnetic field, i.e., as the particle moments align with the magnetization. When the particle moments align with the magnetization of the film, the particle moments become more susceptible to the magnetic flux changes caused by the precessing magnetization in the film, and thus, couple more strongly to it. As a comparison, the damping coefficient of the "as grown" sample is independent of the applied field.

Figure 11:
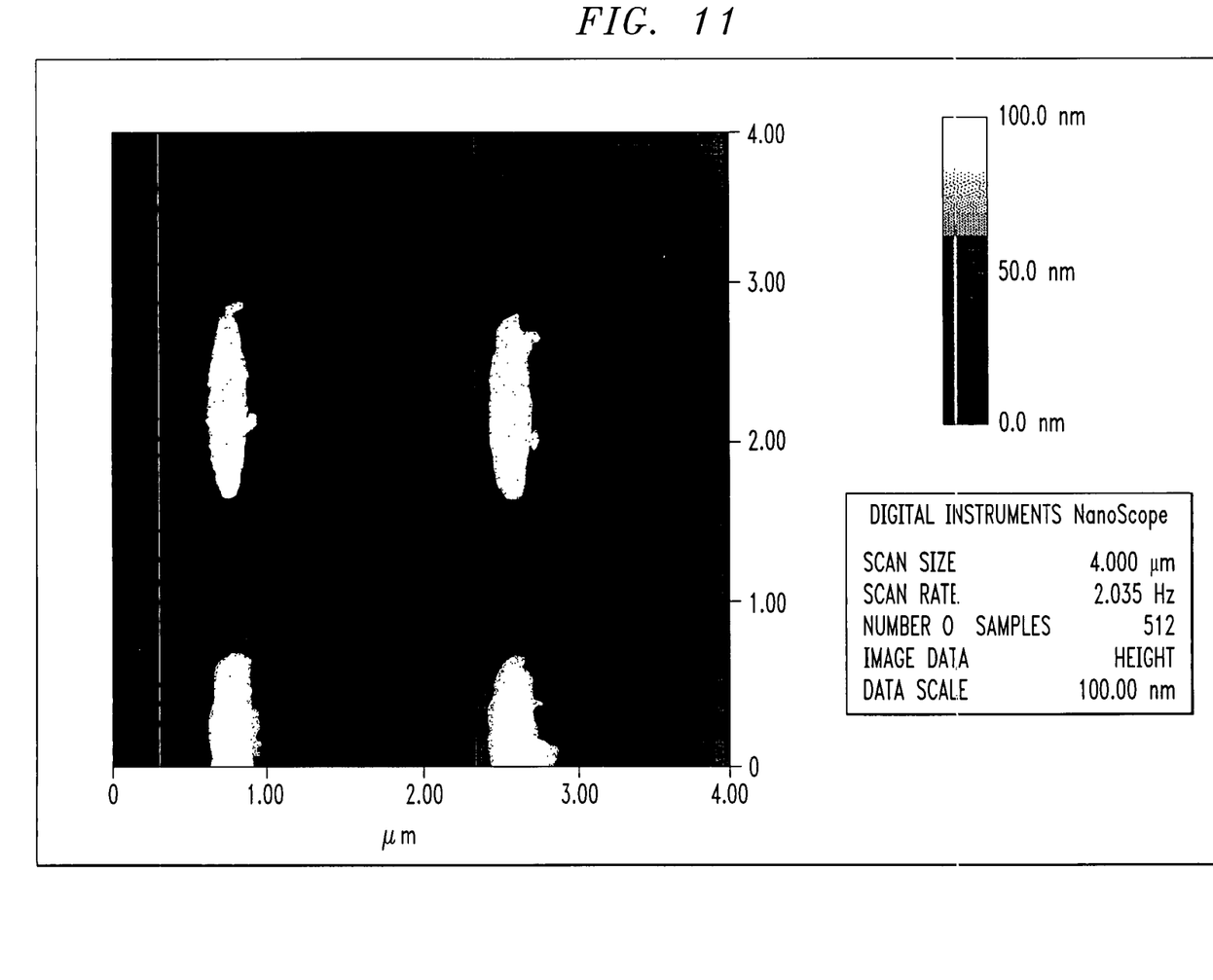
FIG. 11 is an atomic force microscopic image of a section of an ellipsoidal magnetic elements array according to an embodiment of the present invention.

To estimate the effect of superparamagnetic layers on the coercivity of magnetic elements, superparamagnetic nanoparticles were deposited on an array of ellipsoidal magnetic elements. FIG. 11 is an atomic force microscopic image of a section of the ellipsoidal magnetic elements array. An array of identical (electron-beam lithographically defined) elements were used to make the magnetic signal large enough to measure. Thus, the average properties of the array were measured. Given the fact that the array was carefully defined, the properties from one element to another did not vary significantly. Thus, the average properties of the array provided a good estimate of the properties of the individual elements.

Table 1, below, shows the effects of depositing nine nanometer diameter spherical magnetic nanoparticles, comprising cobalt, on top of a rectangular array of $Ni_{80}Fe_{20}$ ellipsoids (with the dimensions: {short axis} 0.24 micrometers by {long axis} 0.84 micrometers by {thickness} five nanometers). As described above, an image of a section of the ellipsoidal magnetic elements array is shown in FIG. 11. The ellipsoids are separated by 1.5 micrometers (edge to edge) in the direction of the short axis and one micrometer in the direction of the long axis. In another case, a non-magnetic polymer layer was deposited under the particle layer. The non-magnetic polymer layer restricted the particle deposition to one monolayer of particles. In yet another case, a dilute mixture of nanoparticles suspended in octane was deposited. That technique did not limit the deposition to a monolayer, but would limit the number of layers that may be deposited due to the weak particle concentration.

TABLE 1

| Sample: | Coercive field, $H_c$ (Oersted) | Percentage of "as-deposited array" |
|---|---|---|
| As-deposited ellipsoid array. | 105 | 100 |
| Array with monolayer of particles. | 75 | 71 |
| Array with dilute particle deposition. | 65 | 62 |

It is evident from the data in Table 1 that the coercive field of the ellipsoid array is significantly reduced by the introduction of the particle layer on top of it.

What is claimed is:

1. A magnetic switching device comprising two magnetic layers with a barrier layer therebetween, wherein at least one of the magnetic layers comprises a magnetic film comprising superparamagnetic particles on at least one surface thereof, wherein the barrier layer comprises oxidized aluminum.

2. The magnetic switching device of claim 1, wherein the superparamagnetic particles are spatially separated from the magnetic film.

3. The magnetic switching device of claim 2, wherein the superparamagnetic particles are spatially separated from the magnetic film by about ten angstroms to about 100 angstroms.

* * * * *